(12) United States Patent
Narasimha et al.

(10) Patent No.: US 9,581,649 B2
(45) Date of Patent: Feb. 28, 2017

(54) METHOD AND APPARATUS FOR LOAD FAULT DETECTION

(71) Applicant: Texas Instruments Incorporated, Dallas, TX (US)

(72) Inventors: Rajan Lakshmi Narasimha, Dallas, TX (US); David Patrick Magee, Allen, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/836,037

(22) Filed: Aug. 26, 2015

(65) Prior Publication Data

US 2016/0238660 A1 Aug. 18, 2016

Related U.S. Application Data

(60) Provisional application No. 62/116,841, filed on Feb. 16, 2015.

(51) Int. Cl.
*H02P 27/00* (2006.01)
*G01R 31/34* (2006.01)
*H02M 7/5387* (2007.01)

(52) U.S. Cl.
CPC ....... *G01R 31/346* (2013.01); *H02M 7/53875* (2013.01)

(58) Field of Classification Search
CPC ...... H02P 21/003; H02P 29/25; H02M 7/125; H02M 5/452; H02M 7/53875; G01R 31/42
USPC ............ 363/34–37, 39–40, 44, 47, 49, 121; 318/400.02, 721, 432, 727, 779, 800, 801, 318/807, 808, 811–813
See application file for complete search history.

(56) References Cited

U.S. PATENT DOCUMENTS

| | | | | |
|---|---|---|---|---|
| 3,732,464 A | * | 5/1973 | Miki | H02H 3/405 361/80 |
| 4,455,612 A | * | 6/1984 | Girgis | H02H 3/40 361/80 |
| 6,483,435 B2 | * | 11/2002 | Saha | G01R 31/088 324/525 |
| 7,728,537 B2 | * | 6/2010 | Tomigashi | H02P 21/06 318/400.02 |

(Continued)

OTHER PUBLICATIONS

Grubic et al., "A Survey on Testing and Monitoring Methods for Stator Insulation Systems of Low-Voltage Induction Machines Focusing on Turn Insulation Problems", IEEE Transactions on Industrial Electronics, vol. 55, No. 12, Dec. 2008, pp. 4127-4136.

(Continued)

*Primary Examiner* — Rajnikant Patel
(74) *Attorney, Agent, or Firm* — Ronald O. Neerings; Charles A. Brill; Frank D. Cimino

(57) ABSTRACT

Described examples include controllers and methods for controlling an inverter to drive a load and for detecting load faults by determining phasor values representing voltages and currents associated with the individual load phases based on sets of input values, determining voltage and current sequence components according to the phasor values, determining a sequence impedance value by recursively solving a set of update equations at least partially according to the voltage and current sequence components, and detecting a load fault when the sequence impedance value exceeds a threshold value.

21 Claims, 4 Drawing Sheets

(56) References Cited

U.S. PATENT DOCUMENTS 8,330,438 B2 * 12/2012 Sreenivas ........... H02M 3/1584
323/272

OTHER PUBLICATIONS

Lee et al., "An On-Line Stator Turn Fault Detection Method for Interior PM Synchronous Motor Drives", IEEE, Applied Power Electronics Conference, Feb. 25-Mar. 1, 2007, pp. 825-831.
Lee et al., "A Robust, On-Line Turn-Fault Detection Technique for Induction Machines Based on Monitoring the Sequence Component Impedance Matrix", IEEE Transactions on Power Electronics, vol. 18, No. 3, May 2003, pp. 865-872.

* cited by examiner

METHOD AND APPARATUS FOR LOAD FAULT DETECTION

The present application claims priority to, and the benefit of, U.S. Provisional Patent Application Ser. No. 62/116,841, filed Feb. 16, 2015 and entitled ALGORITHMIC TECHNIQUES FOR RESOURCE EFFICIENT SEQUENCE IMPEDANCE ANALYSIS OF STATOR WINDING FAULTS, the entirety of which is hereby incorporated by reference.

TECHNICAL FIELD

The present disclosure relates to detection of load faults in electrical power systems, and more particularly to methods and control apparatus for detecting faults in a load having a plurality of load phases.

BACKGROUND

AC induction motors and other multiphase electrical loads are often driven by a multiphase inverter providing AC output voltages and currents to the driven load. Degradation or faults in motor windings can contribute to motor failures or degradation of the driven motor load and/or the power source. Accordingly, detection of the onset of motor winding degradation and other load faults can be useful for proactive maintenance to avoid or mitigate the onset of overheating and/or stator winding insulation breakdown and the like.

SUMMARY

In described examples, load impedance faults or other load faults are detected through automated analysis of sequence impedance values estimated or otherwise determined based at least in part on measured voltage and current values associated with a driven load. Example controllers and methods are described to detect load faults by determining voltage and current sequence components according to phasor values representing voltages and currents associated with the individual load phases, determining an impedance value by recursive computation of update equations at least partially according to the sequence components, and detecting a load fault when the sequence impedance value exceeds a threshold value. In certain implementations, the load is driven by an inverter with controlled setpoint values to selectively cause an unbalance in the applied load voltages for discernible excitation of off-diagonal sequence impedance values to facilitate load fault detection. In some examples, the sequence impedance value is determined in real time while the load is actively driven by an inverter, with intelligent estimation update equations, such as least mean squares (LMS) algorithms being solved recursively to update an estimated sequence impedance value excited according to the inherent unbalance conditions associated with close loop driving of the load.

DETAILED DESCRIPTION

Figure 1:
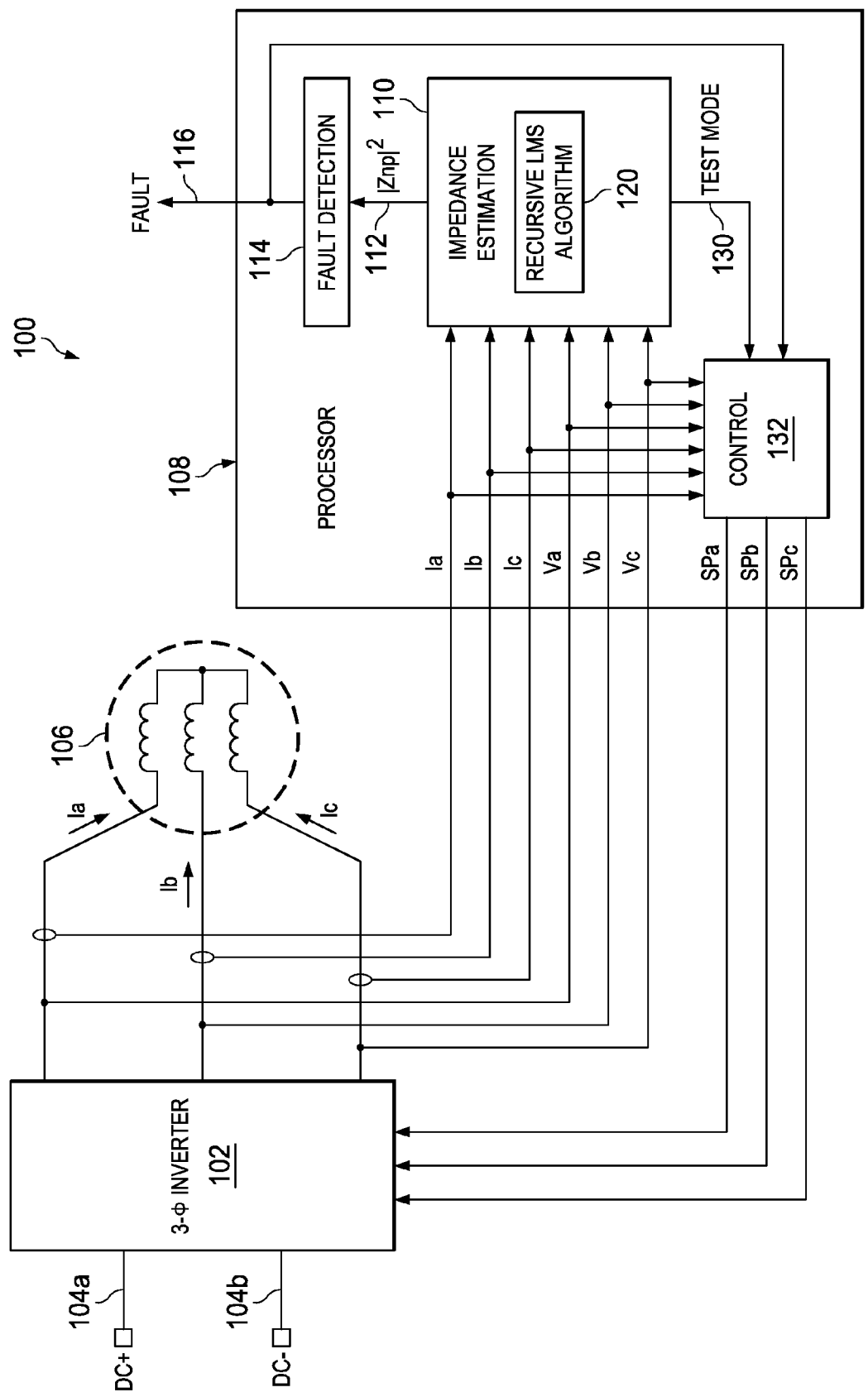
FIG. 1 is a schematic diagram of an inverter driving a three-phase load and a controller controlling the inverter to drive the load and to detect load faults.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

FIG. 1 shows a power conversion system 100 with a three-phase inverter 102 receiving DC input power via positive and negative DC input connections 104a (DC+) and 104b (DC−), respectively. The inverter 102 provides three-phase output voltages and currents to drive a motor load 106. The inverter 102 is operated according to control signals from a controller including a processor 108. In one example, the processor 108 is a microcontroller or digital signal processor (DSP) integrated circuit (IC) providing phase-specific setpoint values SPa, SPb and SPc corresponding to output motor phases a, b and c, respectively, to the inverter 102 for generating corresponding phase voltages Va, Vb and Vc to drive the motor load 106. Provision of the three-phase output voltages Va, Vb and Vc creates currents Ia, Ib and Ic flowing in the windings of the motor load 106. The control processor 108 provides the setpoint control values and may implement various load control (e.g., motor drive) processes and tasks illustrated in FIG. 1 as a control component 132.

Although illustrated in the context of a three-phase motor drive application, various concepts of the present disclosure can be employed in other applications for driving a multiphase load and/or detecting load faults thereof. Moreover, any suitable electronic processing circuitry can be used to implement one or more processors 108 and associated electronic memory operable when powered according to corresponding program instructions or code, or according to preconfigured logic, or combinations thereof, in order to implement the control, sequence impedance estimation and fault detection functions set forth herein.

In one example, the processor 108 implements the control component 132 to operate the inverter 102 in a closed-loop manner according to one or more feedback signals or values representing the load currents and voltages Ia, Ib, Ic, Va, Vb and Vc, for example, to regulate one or more performance metrics associated with the driven load 106, such as speed, torque, etc. The processor 118 also implements an impedance estimation component 110 to recursively solve a set of equations at least partially according to voltage and current sequence components (e.g., positive, negative and/or zero sequence components Vp, Vn, Vz, Ip, In and/or Iz) as described further hereinafter. In the illustrated example, the impedance estimation component 110 determines a desired value, an input value, an error value and at least one updated sequence impedance value, or a squared updated sequence impedance value such as the squared absolute value $|Znp|^2$ using a recursive least mean squares (LMS) algorithm implemented as a set of update equations 120 according to the voltage and current sequence components. In one example shown in FIG. 1, the impedance estimation component 110 provides a signal or value 112 representing the estimated sequence impedance value (e.g., $|Znp|^2$) to a fault detection component 114 implemented by the processor 118 for comparison with a threshold TH to selectively identify a load fault. The fault detection component 114 in this example provides a fault signal or message 116 for use in notifying repair or maintenance personnel or an external system (not shown), and the detected fault signal 116 is provided to the control component 132 for use in taking one or more predetermined control actions, such as shutting down the inverter 102.

In one embodiment, the impedance estimation component 110 is implemented by the processor 108 to provide a mode control signal or message 130 (labeled "TEST MODE" in the drawing) to initiate off-line or open loop impedance estimation testing. In this test mode, the control component 132 controls the inverter setpoint values SPa, SPb and SPc to excite certain off-diagonal or off-diagonal sequence impedance matrix terms to facilitate estimation of one or more sequence impedance values such as $|Znp|^2$. The processor 108 in one example is interfaced with the inverter 102 using suitable driver and/or switch control circuits (not shown) to provide switching control signals to operate the inverter 102 in order to provide multiphase AC output voltages and currents to drive the load 106 using any suitable AC power control techniques, according to the setpoint values SPa, SPb and SPc. For example, pulse width modulation (PWM) control circuits and components may be provided in the processor IC 108 and/or in the inverter 102 to provide suitable switching control signals to operate switches of the multiphase inverter 102 using open or closed-loop operating modes. In some examples, the processor 108 provides the setpoint values SPa, SPb and SPc for use in driving the load 106 in open loop fashion. In other examples, the setpoint values are provided in closed loop fashion according to the feedback signals or values representing the sensed load currents and voltages Ia, Ib, Ic, Va, Vb and Vc as shown in FIG. 1.

Figure 2:
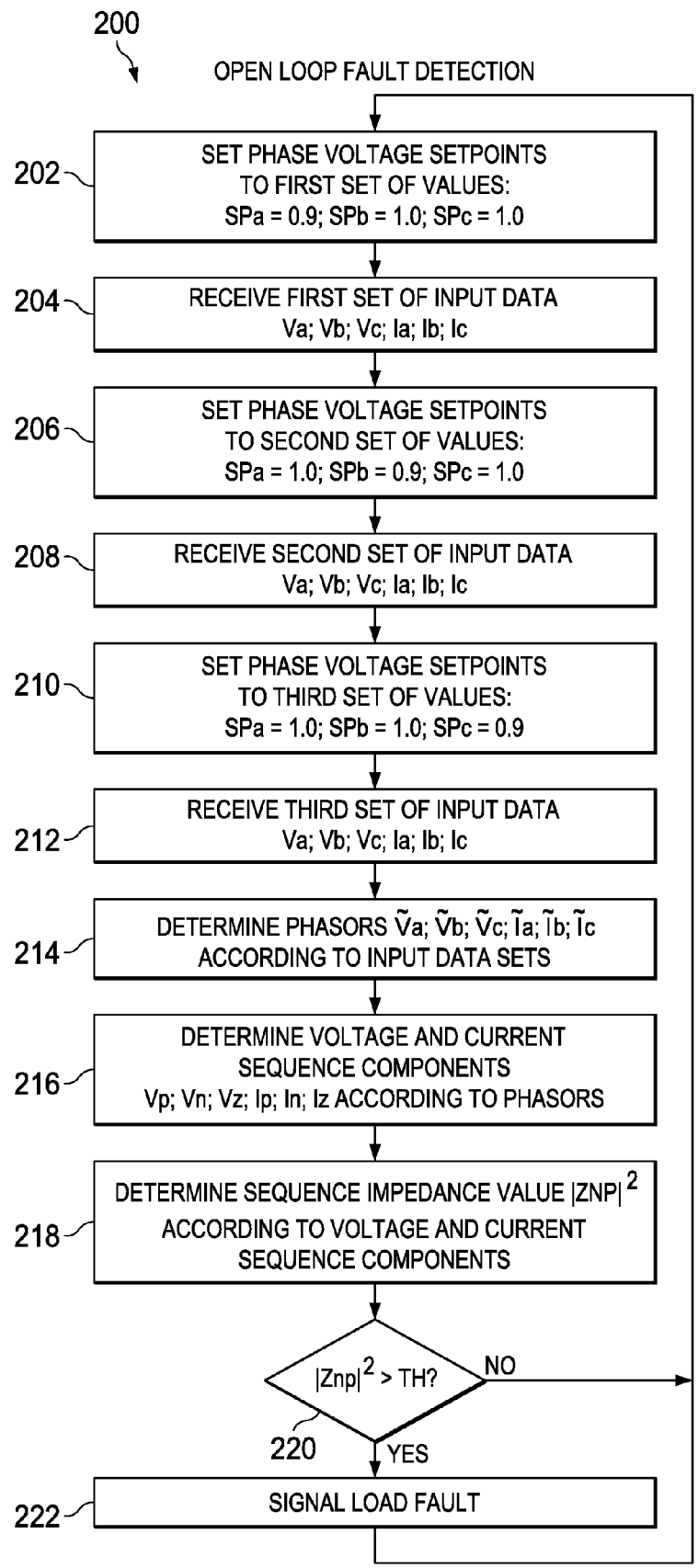
FIG. 2 is a flow diagram of an open loop fault detection method.

Referring also to FIG. 2, an example open loop fault detection process or method 200 is illustrated. The method 200 in one example is implemented by the processor 108 of FIG. 1 implementing the impedance estimation component 110, the fault detection component 114 and the control component 132. The processor 108 controls the inverter 102 to selectively provide voltages and/or currents to the load 106, and receives a plurality of sets of input values Va, Vb, Vc, Ia, Ib and Ic. The individual input value sets in one example represent the load phase voltages and currents at a corresponding plurality of sample times.

In one implementation, the processor 108 implements an inverter output voltage setpoint control scheme to create intentional voltage unbalances in the driven load 106. This induced unbalance excites off-diagonal (i.e., non-diagonal) terms of a sequence impedance matrix relating positive, negative and zero sequence voltages and currents of the load 106. The excitation of the off-diagonal sequence impedance matrix terms facilitates identification of load faults or load degradation, for example, faults or degradation of a winding of a motor load 106. In the example process 200 of FIG. 2, the processor 108 intelligently creates voltage unbalance conditions using the control component 132 to facilitate monitoring of one or more off-diagonal sequence impedance matrix terms using the impedance estimation component 110. The monitored sequence impedance matrix term or terms are evaluated by the fault detection component 114 in order to selectively detect at least one load fault condition. The processor 108 in one example implements the open loop or off-line fault detection process 200 in a test mode with the mode change signal 130 of FIG. 1 asserted, and can then switch operation to a normal or closed loop operating mode for driving the load 106 using the inverter 102.

At 202 in FIG. 2, the processor 108 sets the phase voltage setpoints to a first set of values. The first set of values can be any set where the setpoints of at least two phase voltages are different. In one example, the processor 108 sets SPa=0.9, SPb=1.0 and SPc=1.0 at 202, and receives a first set of input values representing the voltages and currents associated with the load 106 (e.g., Va, Vb, Vc, Ia, Ib and Ic) at 204. At 206, the processor 108 sets the voltage setpoints to a second set of values, in one example with SPa=1.0, SPb=0.9 and SPc=1.0, and receives a corresponding second set of input values at 208. The voltage setpoints are set to a third set of values at 210 (SPa=1.0, SPb=1.0 and SPc=0.9), and a third set of input values is received at 212.

The voltage input values can be line-line voltages in one example, or these can be line-neutral voltages in other examples. In general, the processor 108 can obtain multiple blocks of sample sets, where the sample sets each correspond to a given sample time. In the example of FIG. 2, the sample sets are associated with particular sets of setpoint values, where the setpoint value sets create intentional unbalance conditions at the load 106 to excite off-diagonal sequence impedance values to facilitate monitoring for use in load fault detection. In the illustrated example, the processor 108 creates voltage unbalance conditions by the setpoint adjustments at 202, 206 and 210 to excite off-diagonal sequence impedance matrix terms to help sequence impedance estimation and monitoring at 214-218 for use in detecting load faults at 220 and 222.

At 214 in FIG. 2, the processor 108 implements the impedance estimation component 110 of FIG. 1 to determine voltage and current phasor values $\tilde{V}a, \tilde{V}b, \tilde{V}c, \tilde{I}a, \tilde{I}b$ and $\tilde{I}c$ representing voltages and currents associated with the individual load phases a, b, c at least partially according to a plurality of sets of input values Va, Vb, Vc, Ia, Ib and Ic. Any suitable phasor computation techniques or formulas can be used at 214 to determine the phase voltage and current phasors in the frequency domain based on the time domain sample sets. The voltage phasors $\tilde{V}a, \tilde{V}b$ and $\tilde{V}c$ determined at 214 can represent frequency domain line-line voltages or line-neutral voltages of the load 106 in certain examples. In one example, multiple sets or blocks of input values Va, Vb, Vc, Ia, Ib and Ic are used to determine a single set of phasor values $\tilde{V}a, \tilde{V}b, \tilde{V}c, \tilde{I}a, \tilde{I}b$ and $\tilde{I}c$ at 214.

At 216, the processor 108 determines voltage and current sequence components, including one or more positive, negative and zero sequence components corresponding to the load voltage and current. In one example, positive (p), negative (n) and zero (z) sequence voltage components Vp, Vn and Vz and current sequence components Ip, In and Iz are computed at 216 at least partially according to the phasor values $\tilde{V}a, \tilde{V}b, \tilde{V}c, \tilde{I}a, \tilde{I}b$ and $\tilde{I}c$. Any suitable algorithm or technique can be used at 216 to determine voltage and current sequence components at least partially according to at least some of the phasor values Va, Vb, Vc, Ia, Ib and Ic.

At 218, the processor 108 determines at least one sequence impedance value by recursively solving a set of update equations 402, 404, 406, 408 at least partially according to the voltage and current sequence components Vp, Vn, Vz, Ip, In and Iz. In one example, the processor 108 computes an absolute value of one or more off-diagonal sequence impedances, such as an absolute value of an impedance value Znp (|Znp|) representing the effect of positive sequence voltage on negative sequence current in the load 106. In other implementations, different off-diagonal impedances (e.g., absolute values or squared values) are determined at 208, for example, Zpn representing the effect of negative sequence voltage on positive sequence current, Zpz or $Zp_0$ representing the effect of zero sequence voltage on positive sequence current, etc. In another example, the processor 108 determines one or more squared sequence impedance values, for example, $|Znp|^2$ representing the square of the absolute value of Zpn. Any off-diagonal sequence impedance value (or squared value thereof) can be computed or otherwise determined at 218 which can be affected or excited by unbalance voltage conditions at the load 106, and thus can be monitored for use in load fault detection.

Figure 5:
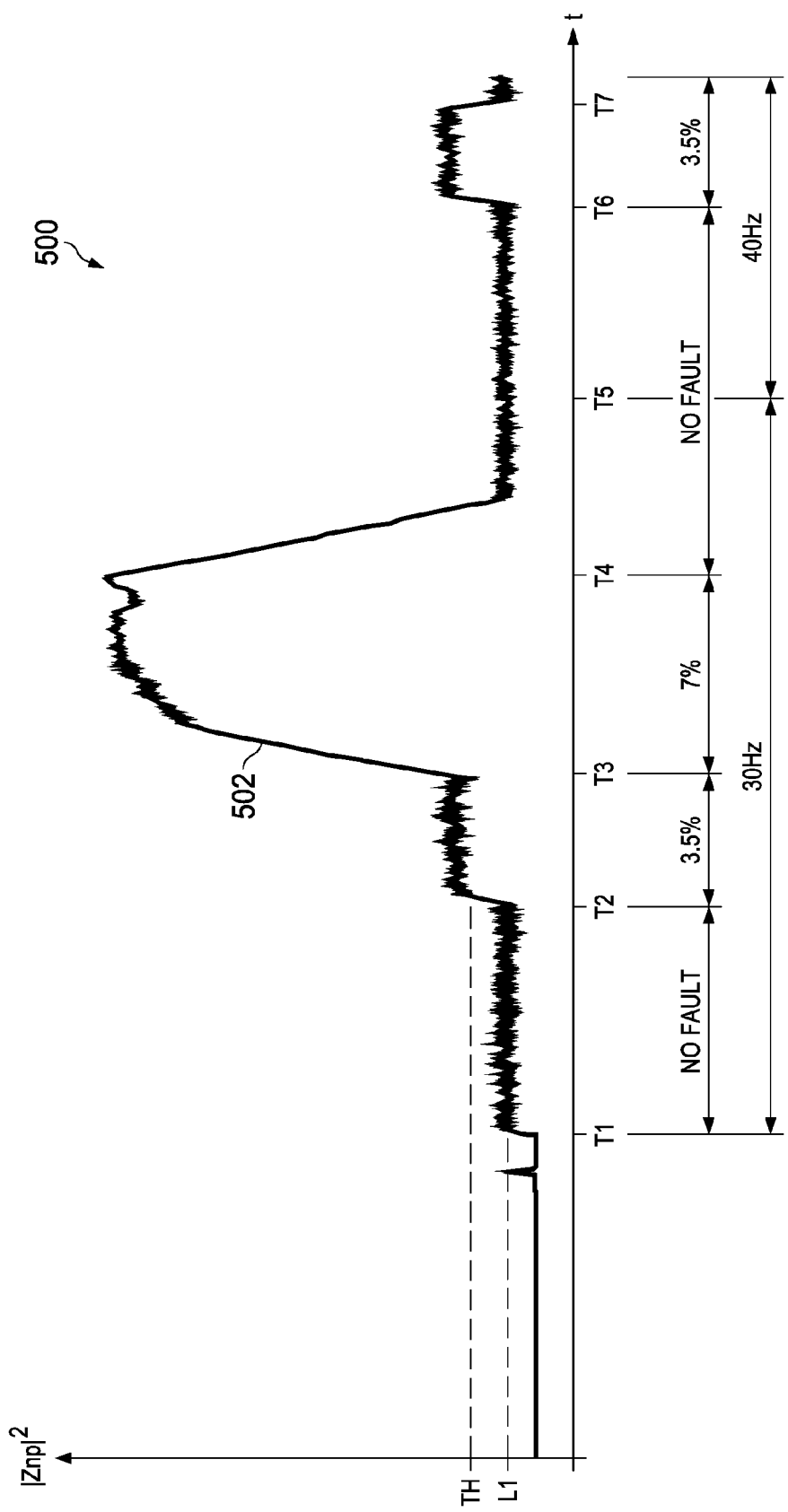
FIG. 5 is a graph of a computed sequence impedance component values as a function of time.

The processor 108 selectively detects one or more load fault conditions at 220 and 222. In the illustrated example, the processor 108 compares the squared sequence impedance value $|Znp|^2$ with a threshold TH at 220. If the sequence impedance value does not exceed the threshold (NO at 220), no load fault or degradation is assumed and the process 200 is repeated at 202-220 as described above. If $|Znp|^2$ is greater than the threshold TH (YES at 220), the processor 108 identifies a fault in the load 106, and signals a load fault at 222. For example, the processor 108 may assert a fault signal 116 (FAULT) as shown in FIG. 1, or may send a fault message to an external system (not shown). In the example of FIG. 1, the fault signal or message 116 is also provided to the control component 132 to initiate a controlled shutdown of the inverter 102 or to take other remedial action. In one example, multiple sequence impedance values can be determined and separately compared with corresponding thresholds, with a load fault being detected at 220, 222 if any of the computed values exceed the corresponding threshold. In other possible implementations, different degrees of fault or degradation conditions in the load 106 can be selectively identified at 220, 222 by comparison of one or more computed off-diagonal sequence impedance values with two or more thresholds. FIG. 5 below illustrates one example in which the determined off-diagonal sequence impedance value $|Znp|^2$ is compared with a single threshold TH for identifying winding faults in a motor load 106.

The process 200 of FIG. 2 thus provides techniques for determining one or more sequence impedance components associated with a load 106 by controlled introduction of unbalanced load conditions. The process 200 and the processor 108 advantageously create the unbalance at 202, 206 and 210 without switches and other additional hardware to connect additional resistors or other circuit components between the output of the inverter 102 and the driven load 106. Moreover, the processor 108 advantageously creates unbalance sufficient to excite the off-diagonal sequence impedance terms of the load impedance matrix as further described below. The time domain phase voltages and currents Va, Vb, Vc, Ia, Ib and Ic are converted at 214 to determine corresponding phasors, which are then converted at 216 to the voltage sequence components Vp, Vn and Vz, and the current sequence components Ip, In and Iz. The sequence components of the load 106 are related according to equation (1) below:

$$\begin{bmatrix} V_p \\ V_n \\ V_0 \end{bmatrix} = \begin{bmatrix} Z_{pp} & Z_{pn} & Z_{p0} \\ Z_{np} & Z_{nn} & Z_{n0} \\ Z_{0p} & Z_{0n} & Z_{00} \end{bmatrix} \begin{bmatrix} I_p \\ I_n \\ I_0 \end{bmatrix}. \quad (1)$$

The "0" subscripts in the equations are used interchangeable with lower case "z" subscripts herein. The sequence impedance matrix terms are a function of the electrical frequency and slip speed for AC induction motor loads 106. Three sets of equations are used to determine the impedance matrix for each set of electrical frequency and slip speed according to three sets of sequence component data. The impedance matrix can be determined according to the following equation (2):

$$\begin{bmatrix} Z_{pp} & Z_{pn} & Z_{p0} \\ Z_{np} & Z_{nn} & Z_{n0} \\ Z_{0p} & Z_{0n} & Z_{00} \end{bmatrix}^T = \left( \begin{bmatrix} I_{p1} & I_{p2} & I_{p3} \\ I_{n1} & I_{n2} & I_{n3} \\ I_{01} & I_{02} & I_{03} \end{bmatrix}^T \right)^{-1} \begin{bmatrix} V_{p1} & V_{n1} & V_{01} \\ V_{p2} & V_{n2} & V_{02} \\ V_{p3} & V_{n3} & V_{03} \end{bmatrix}. \quad (2)$$

The subscripts 1, 2 and 3 in equation (2) refer to the three sets of input data values obtained at 204, 208 and 214 in FIG. 2 at a given slip speed and electrical inverter output frequency. For proper excitation of the off-diagonal sequence impedance values Zpn, Zpz, Znz, Znp, Zzp and Zzn, three unbalance constraints or conditions must be met by the three input data values sets. First, the phase voltages Va, Vb and Vc applied to the load 106 must provide sufficient unbalance to ensure non-zero negative and zero sequence components, otherwise the second and third columns in the sequence voltage matrix in equation (2) become zero and the off-diagonal terms cannot be monitored for detecting load faults. The second constraint is that the unbalance should not result in the motor load 106 departing from the electrical frequency and slip speed conditions for which the input data is being collected. Third, the unbalance introduced in each input data set should be such that the sequence current matrix in equation (2) is invertible, and the columns of the sequence current matrix should not be dependent. For the special case of determining the sub-matrix consisting of Zpp, Zpn, Znp and Znn for line connected machine loads 106, previous unbalanced excitation approaches connect a resistor in one of the phase voltages, where the resistor is turned on and off to obtain two sets of input data values. However, that approach requires addition of a resistor and a switch.

In the open loop or offline method example 200 of FIG. 2, the processor 108 adjusts the setpoints SPa, SPb and SPc to create the unbalance necessary to excite the 3x3 sequence impedance matrix components in equation (1) while ensuring the three constraints described above. This is done without any additional hardware. The example round robin technique can be easily implemented by dual mode operation including a sequence estimation state or test mode during which the processor 108 sets SPa, SPb and SPc and collects the three data sets and returns to normal mode with all the setpoints set to unity for normal mode operation of the inverter 102.

The sequence impedance value or values can be determined at 218 in FIG. 2 using any suitable computational techniques or algorithms. In one example, the determination at 218 is implemented by the processor 108 to recursively solve a set of update equations for each of a succession of sample blocks as described below in connection with FIG. 4. In this example, each sample block includes a plurality of sample times for which a corresponding plurality of sets of input values (e.g., Va, Vb, Vc, Ia, Ib and Ic) are sampled. The process 200 of FIG. 2 illustrates an open loop fault detection example in which the inverter 102 is controlled by the control component 130 implemented by the processor 108 to cause predetermined unbalance conditions at the load 106 through control of the setpoint values SPa, SPb and SPc. In this manner, the processor 108 ensures that the unbalance condition is sufficient to excite the off-diagonal sequence impedance components to allow detection of faults in the windings or other structure of the load 106. In certain implementations, the processor 108 can perform such load fault detection operations when the load 106 is not otherwise in operation, and the processor 108 can be programmed or otherwise configured or adapted to operate in a normal mode for controlling the inverter 102 to drive the load 106, as well as in a test mode for selective estimation of one or more load impedances using the impedance estimation component 110 for use by the fault detection component 114.

Figure 3:
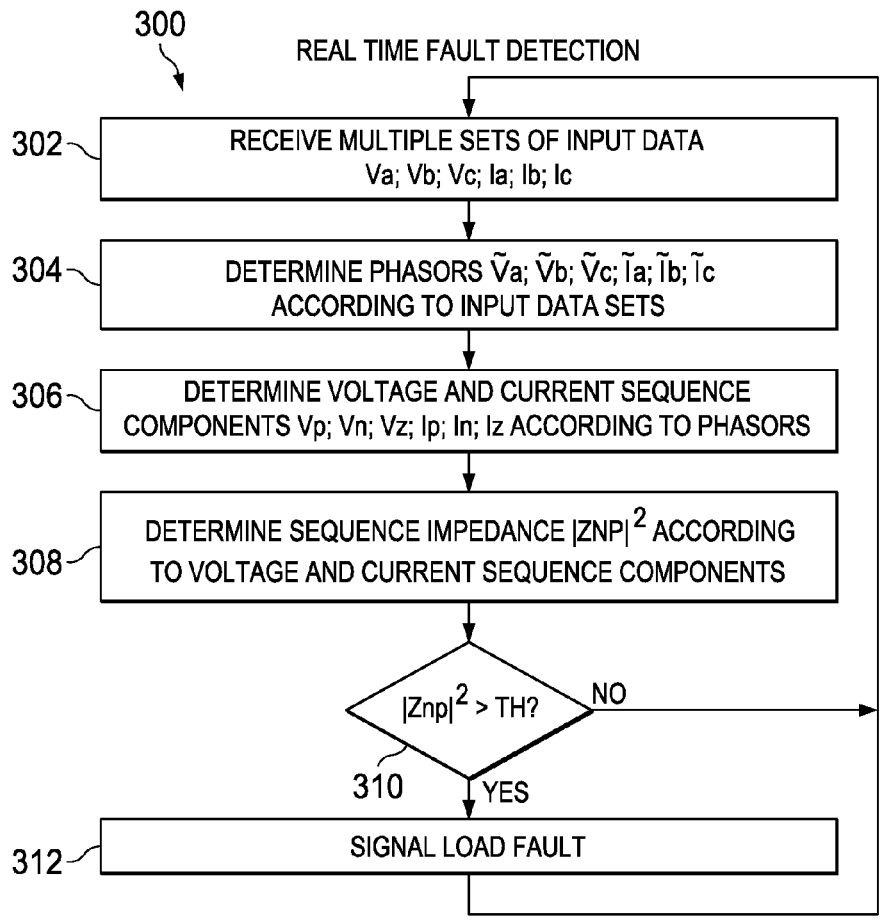
FIG. 3 is a flow diagram of a real-time fault detection method.
Figure 4:
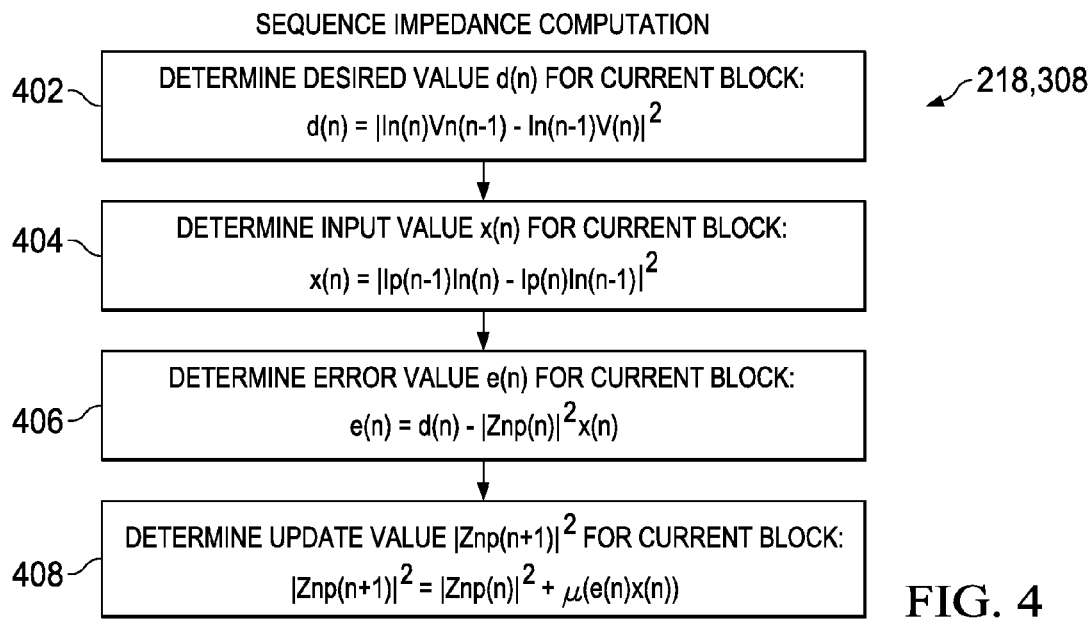
FIG. 4 is a flow diagram of a recursive technique for computing sequence impedance components.

Referring now to FIGS. 3 and 4, FIG. 3 illustrates a method 300 for real-time fault detection which can be implemented by the processor 108 in FIG. 1. Multiple sets of input data values Va, Vb, Vc, Ia, Ib and Ic are received at 302 in FIG. 3 during normal closed loop operation of the system 100 in FIG. 1. The processor 108 in this example determines the phasor values $\tilde{V}a$, $\tilde{V}b$, $\tilde{V}c$, $\tilde{I}a$, $\tilde{I}b$ and $\tilde{I}c$ at 304 according to the input data sets. The voltage and current sequence components Vp, Vn, Vz, Ip, In and Iz are determined at 306 according to the phasor values, and the processor 108 determines at least one sequence impedance value (e.g., a squared value $|Znp|^2$ in one example) at 308 in real time while the load 106 is actively driven by the inverter 102. The process 300 thus provides sequence impedance estimation or determination using the natural unbalance conditions present during closed loop control of a motor or other load 106. Moreover, no additional hardware is required to perform the sequence impedance determination at 302, 304, 306 and 308 in FIG. 3.

The processor 108 in one example uses one or more determined sequence impedance value at 310 and 312 to detect load faults. The processor 108 compares the squared sequence impedance value $|Znp|^2$ with a threshold TH at 310. If $|Znp|^2$ is less than or equal to TH (NO at 310), the process is repeated at 302-308 as previously described. If $|Znp|^2$ exceeds TH (YES at 310), the processor 108 identifies a load fault at 222 and may issue a signal or message (e.g., 116 in FIG. 1).

The example of FIG. 3 provides non-intrusive diagnosis of load faults in real time during normal closed-loop controlled operation of the inverter 102 to drive the load 106. The closed loop control of the inverter 102 according to the current and/or voltage feedback inherently includes unbalances in the inverter output. The control component 132 responds to system imperfections and PWM inverter performance, and the applied load voltage Va, Vb and Vc satisfies the first condition described above. However, the third condition above may not be satisfied at all times for all sample blocks during regular closed loop operation. In this respect, estimation of the sequence impedance using equation (2) is not well suited to such closed loop impedance monitoring, due to computational limitations. In particular, the following equation (3) for the non-diagonal component Znp has a denominator that will approach zero when the third condition above is not met.

$$Z_{np} = \frac{(\tilde{I}_{n2}\tilde{V}_{n1} - \tilde{I}_{n1}\tilde{V}_{n2})}{(\tilde{I}_{p1}\tilde{I}_{n2} - \tilde{I}_{p2}\tilde{I}_{n1})} \quad (3)$$

The denominator of Equation 3 becomes very small when the unbalances in two frames used for the impedance computation are similar. In this situation, the first constraint is met, but the second constraint is not.

FIG. 4 illustrates an example recursive equation set solution for determining the sequence impedance $|Znp|^2$ at 218 in FIG. 2 or 308 in FIG. 3 to provide a recursive algorithm (120 in FIG. 1) which can be implemented by the processor 108, and which does not suffer from the near-zero denominator problems of solving equations (2) or (3). While illustrated and described using the square of the absolute value of Znp, other update equation sets can be used for determining any single or multiple sequence impedance values. In the illustrated examples, moreover, the recursive algorithm 120 is used to determine one or more off-diagonal sequence impedance matrix values, or squares thereof, such as Zpn, Zpz, Znz, Znp, Zzp and/or Zzn.

The example method 400 of FIG. 4 shows solution of a set of update equations at 402, 404, 406 and 408 to implement a least mean squares (LMS) algorithm. The processor 108 in one example implements the algorithm 120 to solve the set of update equations at 402, 404, 406 and 408 for each of a succession of sample blocks, where a previous block is noted below as block "n−1", the current block is indicated as "n" and the next block is indicated as "n+1", etc. The individual sample blocks each include a plurality of sample times for which a corresponding plurality of sets of input values Va, Vb, Vc, Ia, Ib and Ic are sampled.

For each current block "n", the processor 108 determines a desired value d(n) at 402 by solving a desired value equation according to at least some of the voltage and current sequence components Vp, Vn, Vz, Ip, In and Iz determined at 306 in FIG. 3 for the previous sample block "n−1" and the current block "n". In the example of FIG. 4, for the square of the absolute value of Znp, the processor 108 determines d(n) by solving the following equation (4) at 402 in FIG. 4:

$$d(n)=|\text{In}(n)Vn(n-1)-\text{In}(n-1)V(n)|^2. \quad (4)$$

At 404, the processor 108 determines an input value x(n) for the current sample block by solving the following equation (5):

$$x(n)=|Ip(n-1)\text{In}(n)-Ip(n)\text{In}(n-1)|^2. \quad (5)$$

At 406 an error value e(n) is determined for the current sample block according to the difference between the current block desired value d(n) and a product of the input value x(n) for the current sample block and the sequence impedance value of interest ($|Znp|^2$ in this example) according to the following equation (6):

$$e(n)=d(n)-|Znp(n)|^2 x(n). \quad (6)$$

At 408, the processor 108 determines an update value for the sequence impedance term of interest (e.g., $|Znp(n+1)|^2$) for the next sample block according to the sum of the sequence impedance value (e.g., $|Znp(n)|^2$) for the current sample block n and the product of the error value e(n) for the current sample block n and the input value x(n) for the current sample block n by solving the following equation (7):

$$|Znp(n+1)|^2=|Znp(n)|^2+\mu(e(n)x(n)), \quad (7)$$

The term $\mu$ in equation (7) is an update term or step size value. In one example, $\mu$ is a tunable adaptation parameter that controls the convergence rate for the algorithm 120. If $\mu$ is large, the estimated metric is updated faster, because the step size is multiplied by the error term e(n). However, very high step size values μ may lead to overshoot in the metric estimate due to fast response to noise.

Equations (4)-(7) provide a set of update equations for the off-diagonal sequence impedance diagnostic metric $|Znp(n+1)|^2$ which is used (e.g., 218 in FIG. 2 and/or 308 in FIG. 3) for detecting load faults. When the sequence currents for the successive frames are such that the denominator of equation (3) is small, the input value x(n) in equation (5) and hence the update term μ(e(n)x(n)) in equation (7) is small. This ensures that updates to the estimate of the metric $|Znp(n+1)|^2$ are large only when the unbalance introduced by the controller and PWM inverter for adjacent frames are different. In this manner, the estimate of the sequence impedance is not inaccurately updated when one or more of the three unbalance constraints are not met. Moreover, the recursive solution advantageously avoids matrix mathematics, thereby facilitating computational efficiency in real time implementation by the processor 108. In some examples, a sequence impedance matrix term (e.g., Znp or |Znp|) can be used as the recursive algorithm metric, using a corresponding set of update equations for solving a desired value d(n), an input value x(n), an error value e(n) and an update value for the next sample block.

This example is a modified LMS analysis because the squared term is used. Unlike conventional LMS applications directly in the time domain for adaptive filters and the like, described examples use phasors in the frequency domain and then apply the LMS algorithm 120. The illustrated example uses a squared sequence impedance matrix term (e.g., $|Znp|^2$), which advantageously avoids computation of square roots and further promotes computational efficiency and speedy estimation of the sequence impedance for load fault detection in real time. In addition, the described examples avoid division operations of equation (2) above.

FIG. 5 shows a graph 500 of the example estimated off-diagonal sequence impedance matrix value $|Znp|^2$, shown as curve 502 as a function of time. The value $|Znp|^2$ has a nominal value when the load 106 is unpowered, and rises to a normal (e.g., "NO FAULT") level L1 during normal operation with no load faults from T1 through T2. From T2 through T3, a 3.5% motor winding fault or degradation occurs in this example (e.g., winding impedance increase), with the value $|Znp|^2$ rising above a threshold TH. In this example, the processor 108 detects $|Znp|^2$>TH (e.g., 310 in FIG. 3) and identifies a load fault. As mentioned, further or different thresholds can be used for identifying different degrees of load degradation, where the example curve 502 in FIG. 5 rises to a much higher level from T3 to T4, in this case corresponding to a 7% winding fault, which fault is removed at T4 in the graph 500. In the example of FIG. 5, moreover, the curve from T1 through T5 corresponds to a first electrical frequency (e.g., a 2 pole motor driven at 3600 RMP for a 30 Hz electrical frequency, which rises to 40 Hz after T5. As seen in this example, the same threshold level TH can be used at the higher electrical frequency to detect another occurrence of a 3.5% fault from T6 through T7.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims. In addition, although a particular feature of the disclosure may have been disclosed with respect to only one of multiple implementations, such feature may be combined with one or more other features of other embodiments as may be desired and advantageous for any given or particular application.

The following is claimed:

1. A method of detecting faults in a load having a plurality of load phases, the method comprising:
    using at least one processor, determining phasor values representing voltages and currents associated with the individual load phases at least partially according to a plurality of sets of input values, the individual sets representing the voltages and currents associated with the individual load phases at a corresponding plurality of sample times;
    using the at least one processor, determining voltage and current sequence components at least partially according to the phasor values;
    using the at least one processor, determining at least one sequence impedance value by recursively solving a set of update equations at least partially according to the voltage and current sequence components; and
    using the at least one processor, selectively detecting at least one load fault condition at least partially according to the at least one sequence impedance value.

2. The method of claim 1, comprising solving the set of update equations for each of a succession of sample blocks, the individual sample blocks including a plurality of sample times for which a corresponding plurality of sets of input values are sampled, wherein solving the set of update equations comprises, for each sample block:
    determining a desired value for a current sample block by solving a desired value equation according to at least some of the voltage and current sequence components;
    determining an input value for the current sample block by solving an input value equation according to at least some of the voltage and current sequence components;
    determining an error value for the current sample block according to a difference between the desired value for the current sample block and a product of the input value for the current sample block and the at least one sequence impedance value for the current sample block; and
    determining at least one updated sequence impedance value for a next sample block according to a sum of the at least one sequence impedance value for the current sample block and a product of the error value for the current sample block and the input value for the current sample block.

3. The method of claim 2, wherein selectively detecting at least one load fault condition comprises determining whether the at least one sequence impedance value exceeds a threshold value.

4. The method of claim 2, wherein the at least one sequence impedance value is an off-diagonal sequence impedance of a sequence impedance matrix representing the impedance of the load.

5. The method of claim 2, wherein the at least one sequence impedance value is a square of an off-diagonal sequence impedance of a sequence impedance matrix representing the impedance of the load.

6. The method of claim 2, wherein the phasor values, the voltage and current sequence components, and the at least one sequence impedance value are determined in real time while the load is actively driven by an inverter.

7. The method of claim 2, comprising controlling setpoint values of an inverter to selectively cause an unbalance in voltages applied to the load while sampling the plurality of sets of input values.

8. The method of claim 2, wherein the set of update equations implements a least mean squares (LMS) algorithm.

9. The method of claim 2, comprising:
determining the at least one updated sequence impedance value for a next sample block according to a sum of the at least one sequence impedance value for the current sample block and the product of the error value for the current sample block, the input value for the current sample block and a step size value; and
selectively adjusting the step size value to control a convergence of the set of update equations.

10. The method of claim 1, wherein selectively detecting at least one load fault condition comprises determining whether the at least one sequence impedance value exceeds a threshold value.

11. The method of claim 1, wherein the at least one sequence impedance value is an off-diagonal sequence impedance of a sequence impedance matrix representing the impedance of the load.

12. The method of claim 1, wherein the at least one sequence impedance value is a square of an off-diagonal sequence impedance of a sequence impedance matrix representing the impedance of the load.

13. The method of claim 1, wherein the phasor values, the voltage and current sequence components, and the at least one sequence impedance value are determined in real time while the load is actively driven by an inverter.

14. The method of claim 1, comprising controlling setpoint values of an inverter to selectively cause an unbalance in voltages applied to the load while sampling the plurality of sets of input values.

15. The method of claim 1, wherein the set of update equations implements a least mean squares (LMS) algorithm.

16. A method of detecting faults in a load having a plurality of load phases, the method comprising:
receiving a plurality of sets of input values, the individual sets representing voltages and currents associated with the individual load phases at a corresponding plurality of sample times;
using at least one processor, controlling setpoint values of an inverter to selectively cause an unbalance in voltages applied to the load while receiving the plurality of sets of input values;
using the at least one processor, determining phasor values representing voltages and currents associated with the individual load phases at least partially according to the plurality of sets of input values;
using the at least one processor, determining voltage and current sequence components at least partially according to the phasor values;
using the at least one processor, determining at least one sequence impedance value at least partially according to the voltage and current sequence components; and
using the at least one processor, selectively detecting at least one load fault condition at least partially according to the at least one sequence impedance value.

17. A controller for controlling an inverter to drive a load having a plurality of load phases, comprising:
at least one processor operative to:
control the inverter to selectively provide at least one of voltages and currents to the load,
receive a plurality of sets of input values, the individual sets representing voltages and currents associated with the individual load phases at a corresponding plurality of sample times,
determine phasor values representing voltages and currents associated with the individual load phases at least partially according to the plurality of sets of input values,
determine voltage and current sequence components at least partially according to the phasor values, and
determine at least one sequence impedance value by recursively solving a set of update equations at least partially according to the voltage and current sequence components.

18. The controller of claim 17, wherein the at least one processor is operative to selectively detect at least one load fault condition at least partially according to the at least one sequence impedance value.

19. The controller of claim 17:
wherein the at least one processor is operative to solve the set of update equations for each of a succession of sample blocks, the individual sample blocks including a plurality of sample times for which a corresponding plurality of sets of input values are sampled; and
wherein the at least one processor is operative to solve the set of update equations, for each sample block, by:
determining a desired value for a current sample block by solving a desired value equation according to at least some of the voltage and current sequence components,
determining an input value for the current sample block by solving an input value equation according to at least some of the voltage and current sequence components,
determining an error value for the current sample block according to a difference between the desired value for the current sample block and a product of the input value for the current sample block and the at least one sequence impedance value for the current sample block, and
determining at least one updated sequence impedance value for a next sample block according to a sum of the at least one sequence impedance value for the current sample block and a product of the error value for the current sample block and the input value for the current sample block.

20. The controller of claim 17, wherein the at least one sequence impedance value is an off-diagonal sequence impedance of a sequence impedance matrix representing the impedance of the load.

21. The controller of claim 17, wherein the at least one sequence impedance value is a square of an off-diagonal sequence impedance of a sequence impedance matrix representing the impedance of the load.

* * * * *